(12) United States Patent
Gou et al.

(10) Patent No.: US 9,432,040 B2
(45) Date of Patent: Aug. 30, 2016

(54) ANALOG-TO-DIGITAL CONVERTER FOR CORRECTING ERROR AND ANALOG-TO-DIGITAL CONVERTING METHOD

(71) Applicants: SK hynix Inc., Gyeonggi-do (KR); Industry-University Cooperation Foundation Hanyang University, Seoul (KR)

(72) Inventors: Ja Seung Gou, Seoul (KR); Oh Kyong Kwon, Seoul (KR); Min Kyu Kim, Seoul (KR)

(73) Assignees: SK Hynix Inc., Gyeonggi-do (KR); Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 14/660,667

(22) Filed: Mar. 17, 2015

(65) Prior Publication Data

US 2016/0191069 A1 Jun. 30, 2016

(30) Foreign Application Priority Data

Dec. 29, 2014 (KR) ........................ 10-2014-0192001

(51) Int. Cl.
*H03M 1/06* (2006.01)
*H03M 1/08* (2006.01)
*H03M 1/38* (2006.01)
*H03M 1/12* (2006.01)

(52) U.S. Cl.
CPC ............. *H03M 1/08* (2013.01); *H03M 1/1245* (2013.01); *H03M 1/38* (2013.01)

(58) Field of Classification Search
CPC .......... H03M 1/08; H03M 1/20; H03M 1/56; H03M 1/12

USPC ........ 341/156, 155, 118, 120, 163, 164, 170
See application file for complete search history.

(56) References Cited

U.S. PATENT DOCUMENTS

| | | | | |
|---|---|---|---|---|
| 5,973,632 | A * | 10/1999 | Tai | H03M 1/069 341/155 |
| 7,916,061 | B2 * | 3/2011 | Chae | H03M 3/46 341/118 |
| 8,471,751 | B2 | 6/2013 | Wang | |
| 8,508,392 | B2 * | 8/2013 | Nam | H03M 1/069 341/118 |
| 8,854,243 | B2 * | 10/2014 | Yoshioka | H03M 1/38 341/155 |
| 9,030,344 | B2 * | 5/2015 | Chen | H03M 1/187 341/155 |
| 9,143,153 | B1 * | 9/2015 | Tai | H03M 1/442 |
| 2009/0273500 | A1 * | 11/2009 | Krymski | H03M 1/144 341/155 |
| 2011/0260899 | A1 | 10/2011 | Snedeker | |
| 2011/0292261 | A1 * | 12/2011 | Hwang | H04N 5/3575 348/294 |
| 2013/0127647 | A1 | 5/2013 | Huang et al. | |
| 2015/0008308 | A1 * | 1/2015 | Huang | H03M 1/14 250/208.1 |
| 2015/0372688 | A1 * | 12/2015 | Hashimoto | H03M 1/002 348/294 |

FOREIGN PATENT DOCUMENTS

| | | |
|---|---|---|
| KR | 1020100031831 | 3/2010 |
| KR | 1020110104178 | 9/2011 |

\* cited by examiner

*Primary Examiner* — Peguy Jean Pierre
(74) *Attorney, Agent, or Firm* — IP & T Group LLP

(57) ABSTRACT

An analog-to-digital converter includes an upper bit conversion unit suitable for receiving an input signal, and sampling upper bits from the input signal, a lower bit conversion unit suitable for receiving a residual voltage remaining after the sampling of the upper bit conversion unit, and sampling lower bits from the residual voltage, and an error correction unit suitable for correcting an error of the sampled upper bits and the sampled lower bits.

17 Claims, 9 Drawing Sheets

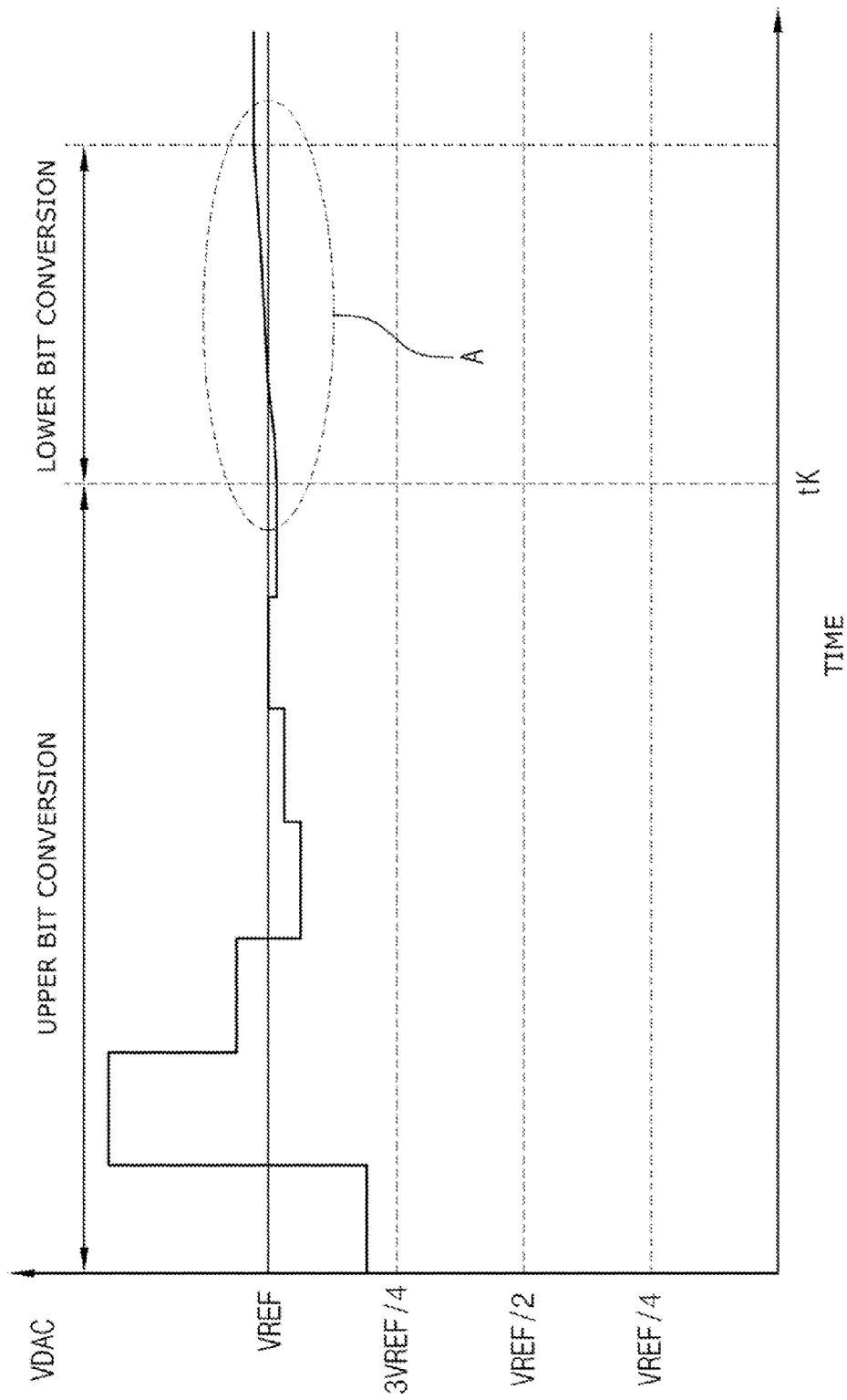

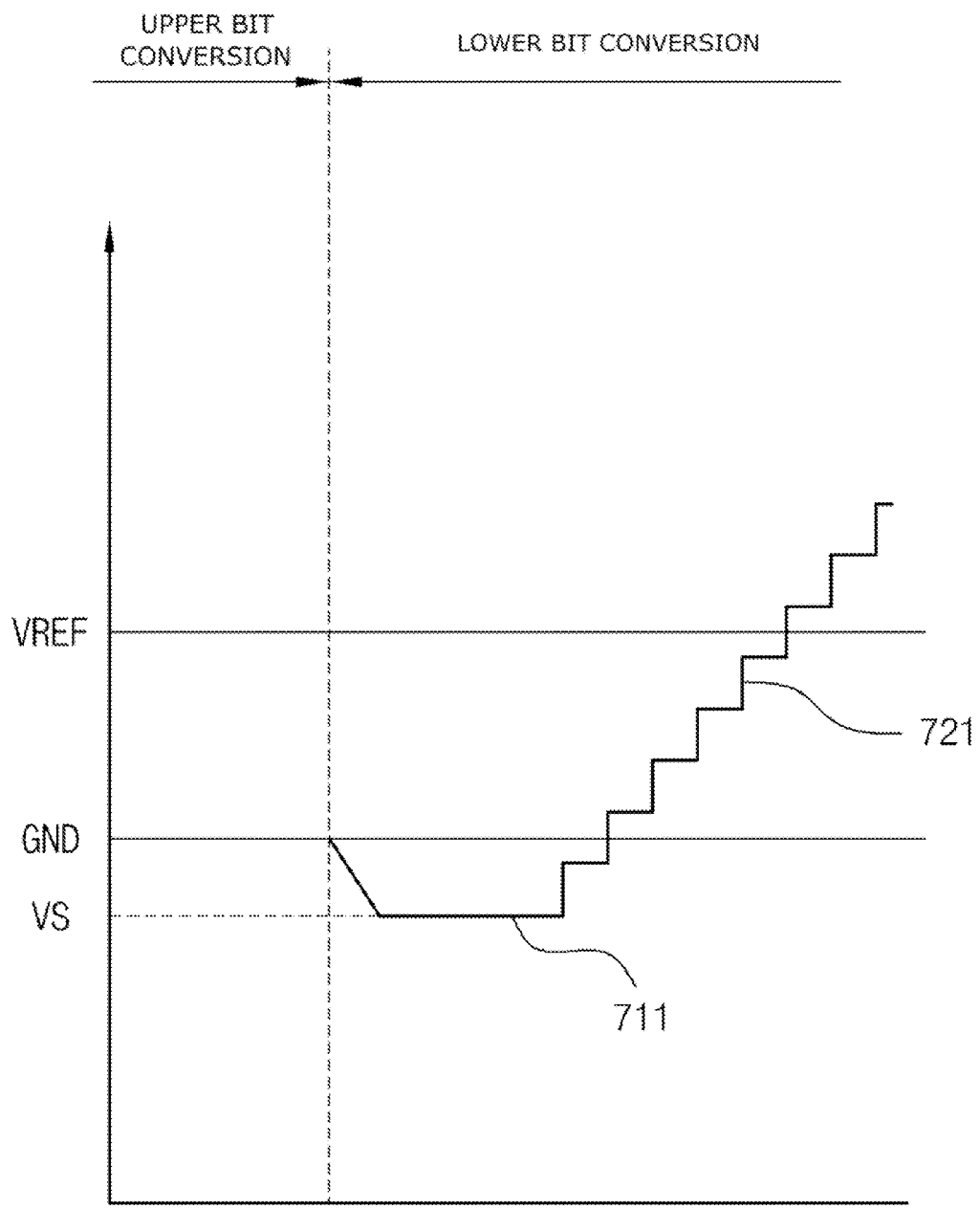

ANALOG-TO-DIGITAL CONVERTER FOR CORRECTING ERROR AND ANALOG-TO-DIGITAL CONVERTING METHOD

CROSS-REFERENCE TO RELATED APPLICATIONS

The present application claims priority of Korean Patent Application No. 10-2014-0192001, filed on Dec. 29, 2014, which is incorporated herein by reference in its entirety.

BACKGROUND

1. Field

Exemplary embodiments of the present invention relate to an analog-to-digital converter and, more particularly, to an analog-to-digital converter that corrects an error generated therein.

2. Description of the Related Art

An analog-to-digital converter converts an analog signal to a digital signal. The analog-to-digital converter is used in an apparatus that processes digital signals. For example, an image sensor receives optical signals (i.e, analog signals) from an external source, converts the optical signals into digital signals, and processes the digital signals. The image sensor includes a pixel array, for receiving the optical signals, and an analog-to-digital converter provided in each column of the pixel array to read a large amount of data at high speed. The analog-to-digital converter used in the image sensor needs to operate with low power, occupy a small area and have high resolution.

In this regard, a successive approximation register (SAR) analog-to-digital converter is used. The SAR analog-to-digital converter has advantages of fast conversion speed and low power consumption because it may convert one bit into a digital signal during one clock cycle. However, since a capacitor array that occupies a large area is included in the SAR analog-to-digital converter, it may not be applied to devices with limited available fabrication area, such as an image sensor.

Furthermore, when a comparator in the SAR analog-to-digital converter performs a comparison operation, an abnormal value may be outputted due to noise occurring in the circuit. Particularly, in the image sensor, since many SAR analog-to-digital converters are driven, the comparator may not normally perform the comparison operation due to limitations in drivability of a reference voltage, so that an error may occur in a digital signal (i.e. an output signal of an analog-to-digital converter).

Korean Application Patent Publication No. 2010-0031831 discloses an SAR analog-to-digital converter with multiple stages for correcting errors.

SUMMARY

Various embodiments are directed to an analog-to-digital converter that may correct an error generated when an analog signal is converted into a digital signal, and an analog-to-digital converting method.

In an embodiment, an analog-to-digital converter includes: an upper bit conversion unit suitable for receiving an input signal, and sampling upper bits from the input signal, a lower bit conversion unit suitable for receiving a residual voltage remaining after the sampling of the upper bit conversion unit, and sampling lower bits from the residual voltage, and an error correction unit suitable for correcting an error of the sampled upper bits and the sampled lower bits.

In an embodiment, an analog-to-digital converter includes: an SAR analog-to-digital converter suitable for sampling upper bits from an input signal; an SS analog-to-digital converter suitable for sampling lower bits from a residual voltage remaining after the sampling of the upper bit conversion unit; and an error correction unit suitable for correcting an error of the sampled upper bits and the sampled lower bits.

In an embodiment, an analog-to-digital converting method includes: sampling upper bits from an input signal; sampling lower bits from a residual voltage that remains after the sampling of the upper bits; and correcting an error of the sampled upper bits and the sampled lower bits.

According to the embodiment of the present invention, an error generated in an apparatus including many analog-to-digital converters may be corrected, so that a low noise signal with high linearity of an analog-to-digital converter may be obtained.

For example, in an image sensor, since many analog-to-digital converters are simultaneously driven to cause a limitation in the drivability of a reference voltage and a power supply, noise in the analog-to-digital converters is increased, so that errors occur in the output signal. According to the embodiments of the present invention, an analog-to-digital converter having high linearity and low noise characteristics may be provided by correcting such errors.

BRIEF DESCRIPTION OF THE DRAWINGS

FIG. 6 is a timing diagram for describing an output voltage of a capacitor array when upper bits and lower bits are sampled.

FIG. 7 is an enlarged diagram of a portion 'A' shown in FIG. 6.

DETAILED DESCRIPTION

Figure 1:
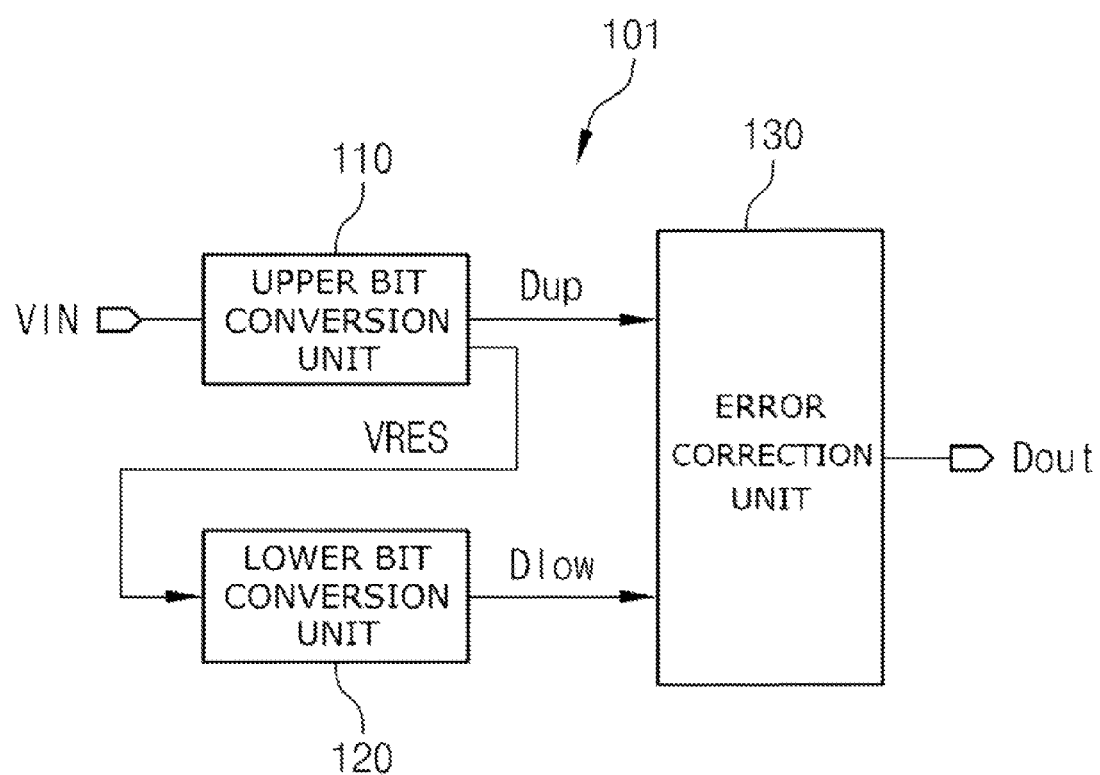
FIG. 1 is a block diagram illustrating an analog-to-digital converter in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

It is also noted that in this specification, "connected/coupled" refers to one component not only directly coupling another component, but also indirectly coupling another component through an intermediate component. In addition, a singular form may include a plural form as long as it is not specifically mentioned.

The drawings are not necessarily to scale and, in some instances, proportions have been exaggerated in order to clearly illustrate features of the embodiments. When a first layer is referred to as being "on" a second layer or "on" a substrate, it not only refers to where the first layer is formed directly on the second layer or the substrate but also to where a third layer exists between the first layer and the second layer or the substrate.

FIG. 1 is a block diagram of an analog-to-digital converter in accordance with an embodiment of the present invention. Referring to FIG. 1, an analog-to-digital converter 101 may include an upper bit conversion unit 110, a lower bit conversion unit 120, and an error correction unit 130.

The upper bit conversion unit 110 receives are input signal VIN from an external (e.g. an external source), that is, an analog signal, samples upper bits from the input signal VIN, converts the upper bits into a digital signal Dup. The upper bits may include N bits (N is a natural number equal to or more than 2) including a most significant bit (MSB). When N bits of the input signal VIN are sampled, a non-sampled voltage, that is, a residual voltage VRES, is generated. The upper bit conversion unit 110 transmits the digital signal Dup to the error correction unit 130 while transmitting the residual voltage VRES to the lower bit conversion unit 120.

The lower bit conversion unit 120 receives the residual voltage VRES outputted from the upper bit conversion unit 110, samples lower bits from the residual voltage VRES, converts the lower bits into a digital signal Dlow. The lower bits include (M+A) bits ('M' is a natural number equal to or more than 2, and 'A' is a natural number corresponding to an error correction bit for example, '1') including a least significant bit (LSB). The lower bit conversion unit 120 transmits the digital signal Dlow to the error correction unit 130.

The error correction unit 130 outputs a (N+M) bit digital signal Dout obtained by combining the digital signal Dup outputted from the upper bit conversion unit 110 and the digital signal Dlow outputted from the lower bit conversion unit 120. The error correction unit 130 corrects an error included in the upper bits and the lower bits by using the 'A' bit.

Figure 2:
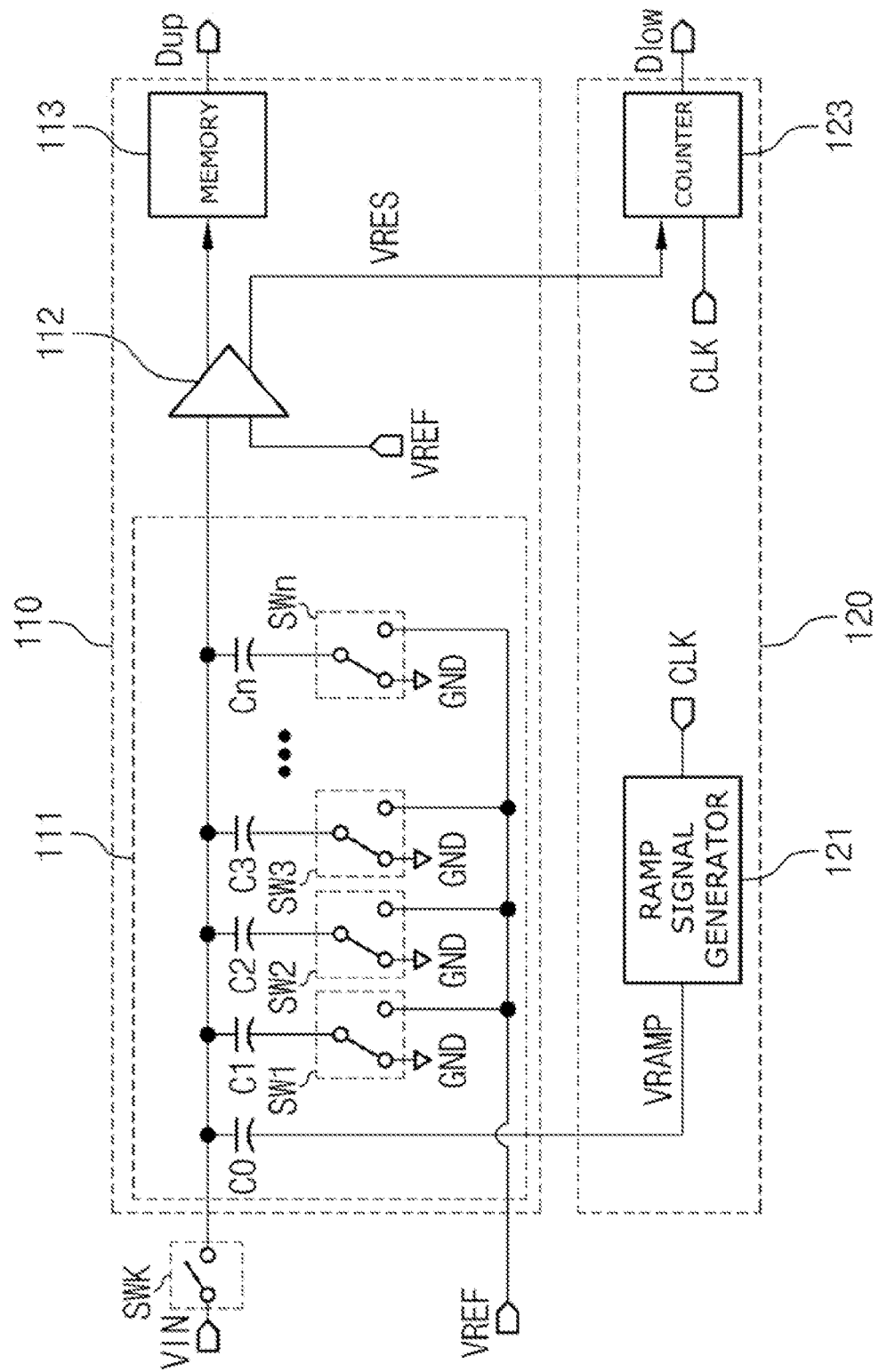
FIG. 2 is a detailed diagram of an upper bit conversion unit and a lower bit conversion unit illustrated in FIG. 1.

FIG. 2 is a detailed diagram of the upper bit conversion unit 110 and the lower bit conversion unit 120 illustrated in FIG. 1. Referring to FIG. 2, the upper bit conversion unit 110 may include a to capacitor array 111, a comparator 112, and a memory 113. That is, the upper bit conversion unit 110 may include a successive approximation register (SAR) analog-to-digital converter.

The analog-to-digital converter 101 may further include a switch SWk that controls the input of the input signal VIN.

The capacitor array 111 includes a plurality of capacitors C0 to Cn and a plurality of switching elements SW1 to SWn. Each switching element, for example, includes one or more MOSFET (metal oxide semiconductor field effect transistor). The switching elements may be controlled by the error correction unit 130 or a controller (not illustrated). It is preferred that one switching element is connected to one capacitor. The capacitors C0 to Cn are connected in parallel to one another. One end of the respective capacitors C0 to Cn is connected to a node for receiving the input signal VIN, and the other end thereof is connected to one end of the respective switching elements SW1 to SWn. The other end of the respective switching elements SW1 to SWn is selectively connected to a ground terminal GND or a reference voltage VREF. The switching elements SW1 to SWn may be controlled by the error correction unit 130 or the controller (not illustrated). The capacitor array 111 samples the upper bits from the input signal VIN. Each of the capacitors C0 to Cn outputs one bit. Among the capacitors C0 to Cn, a signal outputted from the uppermost capacitor Cn corresponds to the MSB of the upper bits outputted from the upper bit conversion unit 110, and a signal outputted from the lowermost capacitor C0 corresponds to the LSB of the bits outputted from the upper bit conversion unit 110. Signals outputted from the capacitor array 111 are inputted to the comparator 112.

The input signal VIN is applied to one end of the lowermost capacitor C0 and a ramp signal VRAMP outputted from a ramp signal generator 121 is applied to the other end thereof. The ramp signal may be a step waveform signal. Accordingly, when the ramp signal VRAMP is applied, the capacitor array 111 outputs a step waveform signal in synchronization with the ramp signal VRAMP.

Initially, all of the switching elements SW1 to SWn are connected to the ground terminal GND. Then, when the signal VIN is inputted to the capacitor array 111 from an external, the switching element SWn to the switching element SW1 are sequentially connected to the reference voltage VREF. Accordingly, the voltages of the capacitors C1 to Cry are sequentially outputted.

The comparator 112 compares the signal outputted from the capacitor array 111 with the reference voltage VREF, and transmits a result of the comparison to the memory 113 and the lower bit conversion unit 120. That is, when the inputted signal is equal to or higher than the reference voltage VREF, the comparator 112 outputs a high level voltage, that is, a power supply voltage of the comparator 112, and when the inputted signal is lower than the reference voltage VREF, the comparator 112 outputs a low level voltage, that is, a ground voltage. The high level voltage is represented by "1" and the low level voltage is represented by "0".

The comparator 112 may be applied with the reference voltage VREF substantially equal to the reference voltage applied to the capacitor array 111. Furthermore, the comparator 112 may be applied with a reference voltage that is different from the reference voltage VREF applied to the capacitor array 111.

The memory 113 receives and stores the signal output from the comparator 112. The memory 113 may include a random access memory (RAM) or a flash memory. Data stored in the memory 113 is outputted to an external under the control of the controller (not illustrated).

The lower bit conversion unit 120 may include the ramp signal generator 121 and a counter 123. The comparator 112 included in the upper bit conversion unit 110 may be shared for an operation of the lower bit conversion unit 120. That is, the lower bit conversion unit 120 may include by a single slope (SS) analog-to-digital converter.

The ramp signal generator 121 receives a clock signal CLK from an external and outputs the ramp signal VRAMP. The ramp signal generator 121 transmits the ramp signal VRAMP to the capacitor C0 for lower bit generation of the upper bit conversion unit 110. The ramp signal VRAMP outputted from the ramp signal generator 121 includes (M+A) bits.

Although it is described that the comparator 112 is provided in the upper bit conversion unit 110 and commonly used by the lower bit conversion unit 120. The lower bit conversion unit 120 may have a separate comparator.

The counter 123 receives the clock signal CLK and the residual voltage VRES outputted from the comparator 112, and samples and outputs the lower bits. The residual voltage VRES is a voltage remaining after the upper bit conversion unit 110 converts the input signal into the digital signal of the upper bits. The lower bits outputted from the counter 123 include (M+A) bits. The N bits outputted from the upper bit conversion unit 110 and the M bits processed from the lower bit conversion unit 120 may have substantially the same number.

Figure 3:
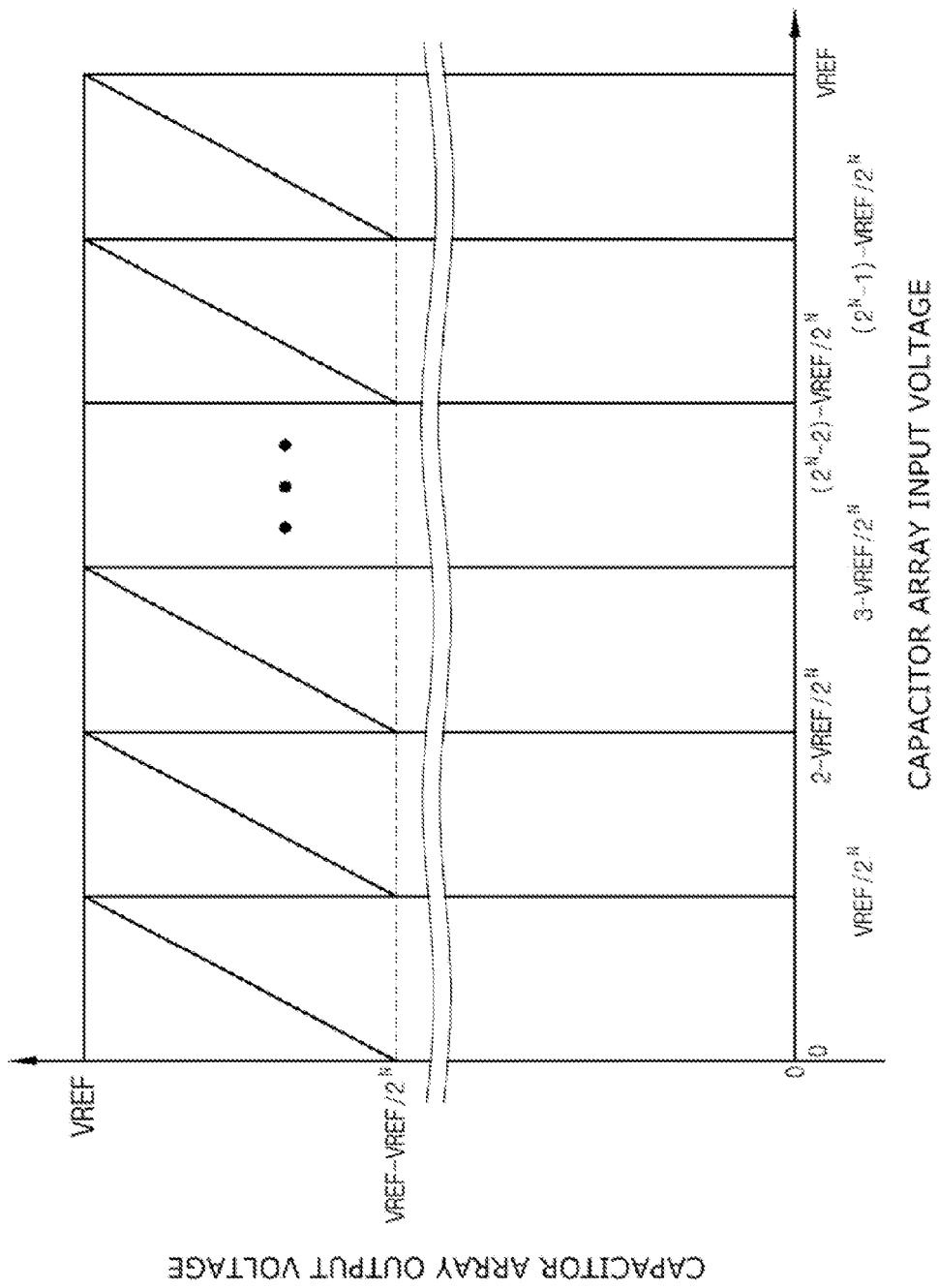
FIG. 3 illustrates an output voltage of a capacitor array generated after upper bits are sampled from an input signal.
Figure 4A:
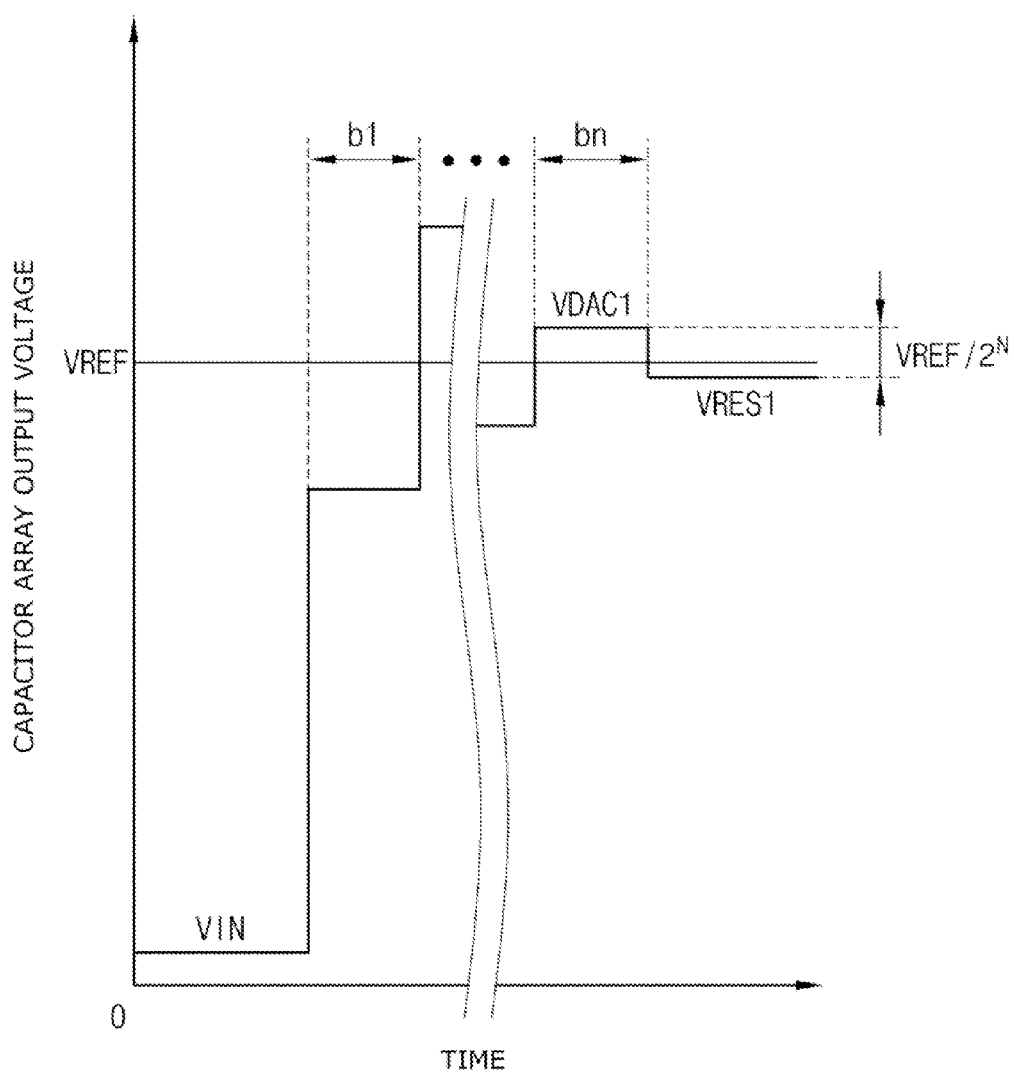
FIGS. 4A and 4B are waveform diagrams for describing a change in an output voltage of a capacitor array when upper bits are sampled in a normal operation of a comparator illustrated in FIG. 2.
Figure 4B:
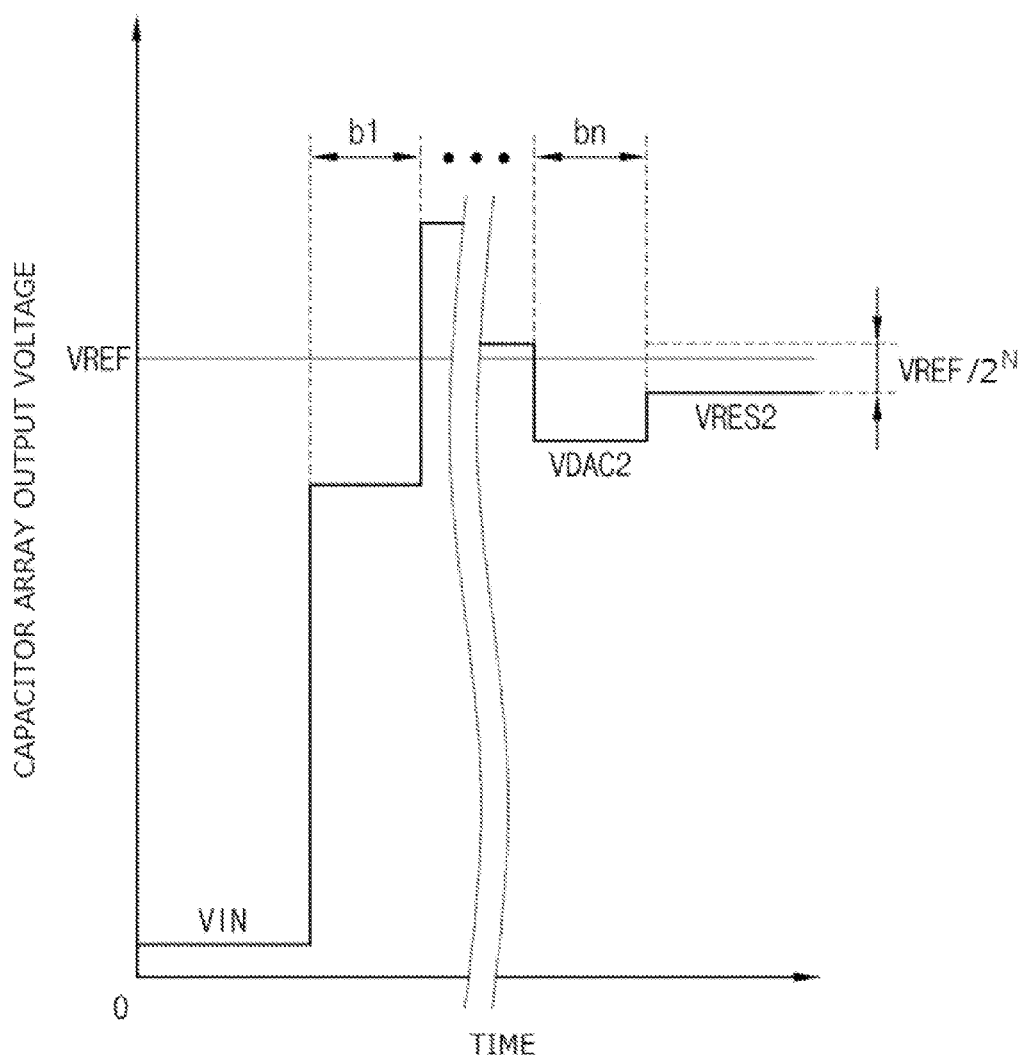
Figure 5A:
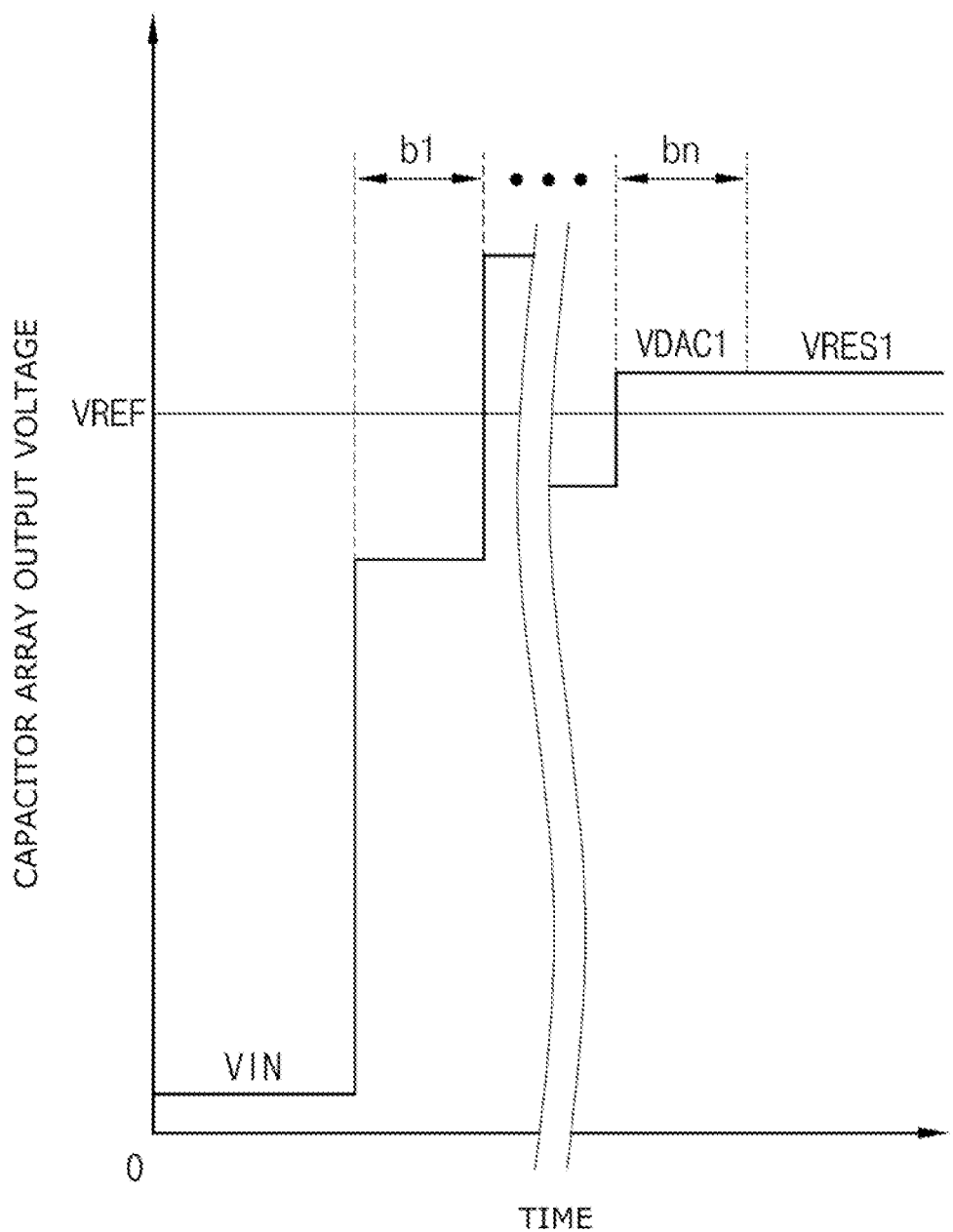
FIGS. 5A and 5B are waveform diagrams for describing a change in an output voltage of a capacitor array when upper bits are sampled in an abnormal operation of a comparator illustrated in FIG. 2.
Figure 5B:
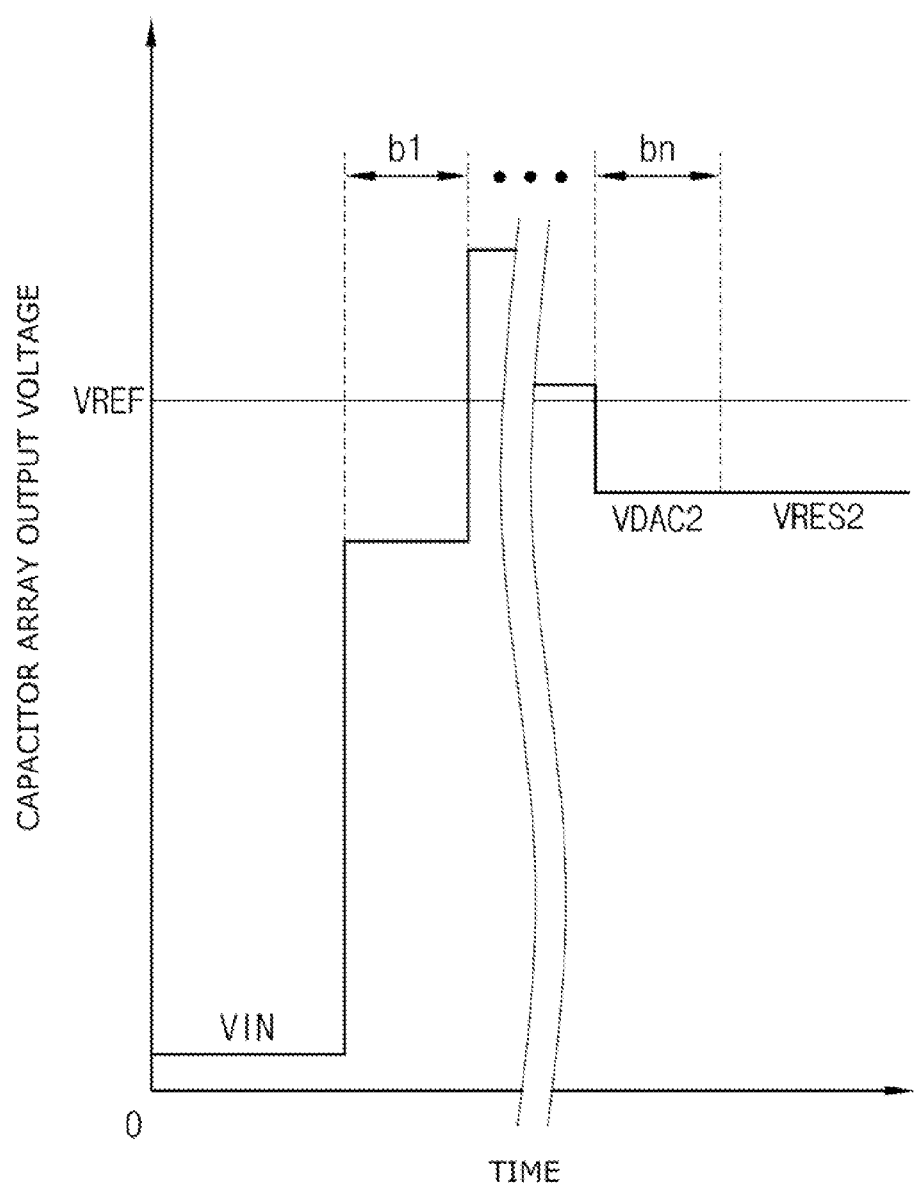

The upper bit conversion unit 110 samples the upper bits from the input signal VIN, compares the upper bits with the reference voltage VREF, and adjusts the reference voltage VREF connected to each capacitor of the capacitor array 111, thereby performing an analog-to-digital conversion operation for the upper N bits. When sampling the least significant bit of the N bits, the lower capacitor C1 of the capacitor array 111 is connected to the reference voltage VREF before the comparator 112 operates. At this time, an output voltage VDAC of the capacitor array 111 is compared with the reference voltage VREF, so that the least significant bit of the upper bits may be obtained. Then, when the least significant bit is '1', that is, when the output voltage VDAC of the lower capacitor C1 is larger than the reference voltage VREF, the lower capacitor C1 is connected to the ground terminal GNB from the reference voltage VREF, and when the least significant bit is '0', that is, when the output voltage VDAC of the lower capacitor C1 is smaller than the reference voltage VREF, the lower capacitor C1 substantially maintains the previously connected reference voltage VREF. Accordingly, the output of the capacitor array 111 has a non-sampled residual voltage VRES as illustrated in FIG. 3. Then, in an operation period of the lower bit conversion unit 120, the ramp signal VRAMP is supplied from the ramp signal generator 121 the output voltage VDAC of the capacitor array 111 is compared with the reference voltage VREF to determine the size of the residual voltage VRES, and the lower bits are sampled.

FIGS. 4A, 4B, 5A and 56 show a change in the output voltage VDAC of the capacitor array 111 when the comparator 112 outputs a normal value and an abnormal value when an $N^{th}$ bit (i.e., the least significant bit) of the upper bits is sampled. To determine the least significant bit, the lower capacitor C1 of the capacitor array 111 is connected to the reference voltage VREF, and the output voltage VBAC has a first voltage VDAC1 higher than the reference voltage VREF or a second voltage VDAC2 lower than the reference voltage VREF. In the case of the first voltage VDAC1, in a normal operation, the comparator 112 outputs '1', and the lower capacitor C1 of the capacitor array 111 is connected to the ground terminal GND from the reference voltage VREF. Accordingly, a first residual voltage VRES1 has a value of (VDAC1−VREF/$2^N$). However, when the comparator 112 outputs an abnormal value, for example, '0', since the lower capacitor C1 of the capacitor array 111 substantially maintains the previously connected reference voltage VREF, the first residual voltage VRES1 has substantially the same value as that of the first voltage VDAC1. In the case of the second voltage VDAC2, in the normal operation, the comparator 112 outputs '0', and the lower capacitor C1 of the capacitor array 111 substantially maintains the previously connected reference voltage VREF, so that a second residual voltage VRES2 has substantially the same value as that of the second voltage VDAC2. However, when the comparator 112 outputs an abnormal value, for example, '1', the second residual voltage VRES2 has a value of (VDAC2−VREF/$2^N$). Accordingly, when the comparator 112 outputs the abnormal value, the residual voltage VRES has an error of VREF/$2^N$ and deviates from the reference voltage VREF in the range (VDAC2−VREF/$2^N$) of an ideal residual voltage VRES.

To correct the error, the analog-to-digital converter 101 uses a ramp signal VRAMP with a constant magnitude and a wider range. That is, the number of steps of the ramp signal VRAMP is increased, and thus the resolution of the lower bit conversion unit 120 is increased from M bits to (M+A) bits. In this case, the total number of steps of the ramp signal VRAMP may be represented by $2^{M+A}$.

FIG. 6 illustrates the output voltage of the capacitor array 111, and FIG. 7 is an enlarged diagram of a portion 'A' shown in FIG. 6. Referring to FIG. 6, in an operation period of the upper bit conversion unit 110, the output voltage substantially maintains the ground voltage GND, and in an operation period of the lower bit conversion unit 120, the output voltage starts to change from a voltage lower than the ground voltage GND, for example, GND−(VREF/$2^M$)×($2^{M+A}$−$2^M$)/2.

In this case, the step size is (VREF/$2^M$) and the total step size is increased from $2^M$ to $2^{M+A}$ Accordingly, a ramp signal VRAMP applied from an external is changed from GND−(VREF/$2^M$)×($2^{M+A}$−$2^M$)/2 to GND+VREF+(VREF/$2^M$)×($2^{M+A}$−$2^M$)/2.

In FIG. 6, the lower bit conversion unit 120 starts to operate, the ramp signal VRAMP applied from the ramp signal generator 121 is changed from the ground voltage GND to GND−(VREF/$2^M$)×($2^{M+A}$−$2^M$)/2, so that the output voltage VDAC of the capacitor array 111 is changed to VRES−(VREF/$2^{M+N}$)×($2^{M+A}$−$2^M$)/2. Then, when the ramp signal VRAMP is applied, the output voltage VDAC of the capacitor array 111 is increased to VRES+VREF/$2^N$+(VREF/$2^{M+N}$)×($2^{M+A}$−$2^M$)/2. To determine the size of the residual voltage VRES, since a maximum value of the output voltage VBAC is larger than the reference voltage VREF, the lower bit conversion unit 120 may sample the residual voltage VRES from VREF−(VREF/$2^{M+N}$)×($2^{M+A}$−$2^M$)/2 to VREF+(VREF/$2^{M+N}$)×($2^{M+A}$−$2^M$)/2.

To obtain a digital output signal Dout having final bits (N+M bits) obtained by combining a sampling result of the upper bits (N bits) and the lower bits (M+A bits) with each other, the error correction unit 130 uses Equation 1 below.

$$D_{OUT} = 2M \times \sum_{i=1}^{N} (D_{UPPER}[i] \times 2^{N-i}) + \sum_{i=1}^{M+A} (D_{LOW}[i] \times 2^{M+A}) \qquad \text{Equation 1}$$

In Equation 1 above, $D_{UPPER}[i]$ denotes the $i^{th}$ digital value of the upper bits (N bits) and $D_{LOW}[i]$ denotes the $j^{th}$ output of the lower bits (M+A, bits). When the comparator 112 outputs an abnormal value, the residual voltage VRES has an error of VREF/$2^N$ as compared with a normal value. The error VREF/$2^N$ of the residual voltage corresponds to a $2^M$ LSB at the time of sampling of the lower bits (M+A bits), and in Equation 1, the $2^M$ LSB is multiplied to the upper bits (N bits) and is then added to the lower bits (M+A bits). In Equation 1, error correction is performed by adding the error generated in the upper bits to the lower bits or subtracting the error from the lower bits.

Hereinafter, an 8 bit analog-to-digital converter for sequentially sampling upper 4 bits and lower 5 bits, for example, N=4, M=4, and A=1 will be described as an example. When it is assumed that a normal analog-to-digital conversion result of the upper 4 bits is '0111' and a normal analog-to-digital conversion result of the lower 5 bits is '00101', the final output Dout of the normal analog-to-digital converter is 117 LSB by Equation 1.

In lowermost bit sampling in the upper 4 bit analog-to-digital to conversion process of the upper bit conversion unit 110, when the comparator 112 outputs an abnormal value, the upper 4 bits is '0110' and the residual voltage VRES has an error of (VREF/$2^4$) with respect to a normal value. The (VREF/$2^4$) corresponds to 16 LSB of the lower 5 bits of the lower bit conversion unit 120. Accordingly, the output of the lower 5 bits for the lower bit conversion unit 120 is '10101', obtained by adding '1000' to '00101' of the normal operation. When the sampling result '0110' of the upper 4 bits and the sampling result '10101' of the lower 5 bits are combined with each other according to Equation 1, the final value of the analog-to-digital converter 101 is 117 LSB, and this value is substantially equal to the final value of a normal analog-to-digital converter.

According to the embodiment of the present invention as described above, an error generated in the process of converting the input signal VIN to the digital signal Dout may be corrected, so that the digital signal bout outputted from the analog-to-digital converter 101 has high linearity and low noise characteristics.

Although various embodiments have been described for illustrative purposes, it will be apparent to those skilled in the art that various changes and modifications may be made without departing from the spirit and scope of the invention as defined in the following claims.

What is claimed is:

1. An analog-to-digital converter comprising:
   an upper bit conversion unit suitable for receiving an input signal, sampling upper bits from the input signal, and outputting a residual voltage remaining after the sampling the upper bits;
   a lower bit conversion unit suitable for receiving the residual voltage from the upper bit conversion unit, and sampling lower bits from the residual voltage; and
   an error correction unit suitable for correcting an error of the sampled upper bits and the sampled lower bits;
   wherein the upper bit conversion unit includes a capacitor array having a lowermost capacitor receiving the ramp signal from the lower bit conversion unit,
   wherein the lower bit conversion unit includes a ramp signal generator suitable for generating the ramp signal and applying the ramp signal to the lowermost capacitor, when sampling the lower bits.

2. The analog-to-digital converter of claim 1, wherein the sampled upper bits include N bits, the sampled lower bits include (M+A) bits, and a digital signal outputted from the error correction unit includes (N+M) bits, where both 'N' and M are natural numbers greater than or equal to 2, 'A' is a natural number corresponding to an error correction bit, and the ramp signal has $2^{M+A}$ steps.

3. The analog-to-digital converter of claim 1, wherein the upper bit conversion unit includes a successive approximation register (SAR) analog-to-digital converter.

4. The analog-to-digital converter of claim 1, wherein the lower bit conversion unit includes a single slope (SS) analog-to-digital converter.

5. The analog-to-digital converter of claim 1, wherein the upper bit conversion unit comprises:
   the capacitor array suitable for sampling the upper bits from the input signal; and
   a comparator suitable for receiving a signal outputted from the capacitor array and converting the signal to a digital signal having the upper bits.

6. The analog-to-digital converter of claim 5, wherein the capacitor array comprises:
   a plurality of capacitors receiving the input signal;
   a plurality of switching elements connected between the respective capacitors and a ground voltage or a first reference voltage; and
   the lowermost capacitor that has a first end receiving the input signal and a second end receiving the ramp signal from the lower bit conversion unit.

7. The analog-to-digital converter of claim 6, wherein the comparator compares a signal outputted from the capacitor array with the first reference voltage.

8. The analog-to-digital converter of claim 6, wherein the lower bit conversion unit comprises:
   the ramp signal generator suitable for generating the ramp signal and applying the ramp signal to the lowermost capacitor; and
   a counter suitable for sampling the lower bits from the residual voltage outputted from the comparator to output the sampled lower bits.

9. The analog-to-digital converter of claim 8, wherein the comparator compares a voltage outputted from the lowermost capacitor with a second reference voltage.

10. The analog-to-digital converter of claim 8, wherein the ramp signal has a step waveform, and the residual voltage outputted from the capacitor array is synchronized with the step waveform.

11. The analog-to-digital converter of claim 8, wherein the ramp signal has a step waveform, that has a value obtained by dividing a voltage, which is obtained by subtracting the first reference voltage from a second reference voltage inputted to the comparator, by $2^M$, where 'M' is a number of the sampled lower bits.

12. The analog-to-digital converter of claim 8, wherein, in an operation period of the upper bit conversion unit, a third reference voltage lower than the first reference voltage is supplied to the capacitor array, and the ramp signal has a step waveform when the ramp signal is lower than the third reference voltage and higher than the first reference voltage.

13. The analog-to-digital converter of claim 8, wherein the sampled upper bits include N bits, the sampled lower bits include (M+A) bits, and a digital signal outputted from the error correction unit includes (N+M) bits, wherein both 'N' and M are natural numbers greater than or equal to 2, and 'A' is a natural number corresponding to an error correction bit, and in an operation period of the lower bit conversion unit, the ramp signal has $2^{M+A}$ steps.

14. The analog-to-digital converter of claim 13, wherein the error correction unit adds a value, which is obtained by multiplying a digital value corresponding to an error of the residual voltage by the N bits, to the (M+A) bits, and outputs a signal having the (M+A) bits.

15. An analog-to-digital converter comprising:
   an SAR analog-to-digital converter suitable for sampling upper bits from an input signal and outputting a residual voltage remaining after the sampling the upper bits;
   a single slope analog-to-digital converter suitable for sampling lower bits from the residual voltage; and
   an error correction unit suitable for correcting an error of the sampled upper bits and the sampled lower bits:
   wherein the SAR analog-to-digital converter includes a capacitor array having a lowermost capacitor receiving the ramp signal from the lower bit conversion unit,
   wherein the SS analog-to-digital converter includes a ramp signal generator suitable for generating the ramp signal and applying the ramp signal to the lowermost capacitor, when sampling the lower bits.

16. The analog-to-digital converter of claim 15, wherein the sampled upper bits include N bits, the sampled lower bits include (M+A) bits, and a digital signal outputted from the error correction unit includes (N+M) bits, wherein both 'N' and M are natural numbers greater than or equal to 2, 'A' is a natural number corresponding to an error correction bit, and the ramp signal has $2^{M+A}$ steps.

17. The analog-to-digital converter of claim 16, wherein the error correction unit adds a value, which is obtained by multiplying a digital value corresponding to an error of the residual voltage by the N bits, to the (M+A) bits, and outputs a signal having the (M+A) bits.

* * * * *